United States Patent
Marosek et al.

[11] Patent Number: 5,798,662
[45] Date of Patent: Aug. 25, 1998

[54] LOW-SIDE DRIVER WITH GATE LEAKAGE DETECTION CIRCUITRY

[75] Inventors: Mark W. Marosek, Sunnyvale; Rich Philpott, San Jose, both of Calif.

[73] Assignee: National Semiconductor Corporation, Santa Clara, Calif.

[21] Appl. No.: 770,080

[22] Filed: Dec. 19, 1996

[51] Int. Cl.[6] .................................................. H03K 3/00
[52] U.S. Cl. .................. 327/109; 327/374; 327/437; 323/284; 361/79; 361/93
[58] Field of Search .................. 327/108–112, 374–377, 327/427, 434, 437; 323/276, 277, 282, 284, 285; 361/78, 79, 88, 93

[56] References Cited

U.S. PATENT DOCUMENTS 5,084,668  1/1992  Kotowski et al. .................. 323/315

OTHER PUBLICATIONS

Jones, Circuit Electronics For Scientists, Addison–Wesley Publishing Co., pp. 403–404, 1974.

*Primary Examiner*—Kenneth B. Wells
*Attorney, Agent, or Firm*—Limbach & Limbach L.L.P.

[57] ABSTRACT

Gate leakage in the DMOS transistor of a low-side driver device is detected and reported by utilizing a sense circuit to sense the voltage on the gate of the DMOS transistor, and by determining whether the voltage on the gate of the DMOS transistor has exceeded a predetermined value within a predefined period of time when the device is turned on.

23 Claims, 3 Drawing Sheets

LOW-SIDE DRIVER WITH GATE LEAKAGE DETECTION CIRCUITRY

BACKGROUND OF THE INVENTION

1. Field of the Invention

The present invention relates to low-side driver devices and, more particularly, to a low-side driver device with gate leakage detection circuitry.

2. Description of the Related Art

A low-side driver device is a circuit that sinks large currents when enabled, and no current when disabled. Low-side driver devices are used in many systems, such as the Anti-Lock Braking System (ABS) used on automobiles, where the ability to control large currents is critical.

FIG. 1 shows a schematic diagram that illustrates a conventional low-side driver device 10. As shown in FIG. 1, device 10 includes a current sink stage 12 which is connected to a load 20 via an output node $N_{OUT}$.

Current sink stage 12, which is also connected to a control node $N_C$, sinks a load current $I_L$ from load 20 which has a magnitude that is defined by the voltage on the control node $N_C$. In the embodiment shown in FIG. 1, current sink stage 12 is implemented with a conventional DMOS transistor M1.

As further shown in FIG. 1, device 10 also includes a control stage 14 which is connected to the output node $N_{OUT}$, the control node NC, an enable node $N_{EN}$, and a flag node $N_F$. Control stage 14 controls the voltage on the control node $N_c$ in response to the logic state of an enable signal EN at the enable node $N_{EN}$.

In addition, control stage 14 sets the logic state of a flag signal FLAG at the flag node $N_F$ to a first logic level when the output voltage $V_{OUT}$ at the output node $N_{OUT}$ is less than a reference voltage $V_{REF}$, and sets the logic state of the flag signal FLAG to a second logic level when the output voltage $V_{OUT}$ is greater than the reference voltage $V_{REF}$.

Control stage 14 includes a comparator stage, which is implemented with a comparator C1 and an inverter I1, that compares the output voltage $V_{OUT}$ at the output node $N_{OUT}$ to the reference voltage $V_{REF}$ and indicates whether the output voltage $V_{OUT}$ is greater than or less than the reference voltage $V_{REF}$.

Control stage 14 also includes a first stage, which is implemented with p-channel transistor MP1, and a second stage, which is implemented with p-channel transistor MP2 and an inverter I2. The drains of both transistor MP1 and transistor MP2 are connected to an intermediate node $N_{IM}$.

The first stage is biased to source a first current $I_1$ when the comparator stage indicates that the output voltage $V_{OUT}$ is greater than the reference voltage $V_{REF}$, while the second stage is biased to source a second current $I_2$ when the comparator stage indicates that the output voltage $V_{OUT}$ is less than the reference voltage $V_{REF}$.

Control stage 14 further includes a switch stage, which is implemented with a gate resistor $R_{GATE}$ and an inverter pair defined by a PMOS transistor MPA and an NMOS transistor MNB, to connect either the intermediate node $N_{IM}$ or ground to the control node $N_c$, i.e., to gate of DMOS transistor M1.

The switch stage passes the first current $I_1$ when the enable signal EN is in a first logic state and the output voltage $V_{OUT}$ is greater than the reference voltage $V_{REF}$, the second current $I_2$ when the enable signal EN is in the first logic state and the output voltage $V_{OUT}$ is less than the reference voltage $V_{REF}$, and ground when the enable signal EN is in a second logic state.

In operation, when device 10 is off and is then turned on, the enable signal EN is deasserted which, in turn, turns on transistor MPA and turns off transistor MNB. When transistor MPA turns on, transistor MP1 (which is biased on from the output of comparator C1) sources a small first current $I_1$ through transistor MPA. The small first current $I_1$, in turn, lifts the voltage on the gate of DMOS transistor M1, thereby turning on transistor M1.

Device 10 utilizes the small first current $I_1$ to only partially turn on DMOS transistor M1 to verify that the output node $N_{OUT}$ is not shorted to a load supply voltage $V_{LD}$. As a result, the magnitude of the current sourced by transistor MP1 is defined so that transistor M1 can not sink more than a predefined current.

If the output node Now is not shorted to the load supply voltage $V_{LD}$, the load current $I_L$ sunk from load 20 by DMOS transistor M1 will pull down the output voltage $V_{OUT}$, which was previously high, to a value less than the reference voltage $V_{REF}$.

When DMOS transistor M1 pulls down the output voltage $V_{OUT}$ to a value below the reference voltage $V_{REF}$, comparator C1 outputs a high voltage which turns off transistor MP1 and turns on transistor MP2. When transistor MP2 turns on, transistor MP2 sources a large second current $I_2$ through transistor MPA which further lifts the voltage on the gate of transistor M1 to a final voltage which drives transistor M1 into saturation. When DMOS transistor M1 is saturated, the output voltage $V_{OUT}$ is further pulled down to a saturation voltage.

At the same time that the output of comparator C1 turns on transistor MP2, the output also causes the logic level of the flag signal FLAG output by inverter I1 to fall to a logic low. Thus, when device 10 is operating correctly, the logic level of the flag signal FLAG tracks the output voltage $V_{OUT}$. The flag signal FLAG is used to set a flag which can then be read out through an SPI-compatible register to determine the state of the output voltage $V_{OUT}$.

When device 10 is on and is then turned off, the enable signal EN is asserted which, in turn, turns off transistor MPA and turns on transistor MNB. When transistor MNB turns on, DMOS transistor M1 turns off since the gate of transistor M1 is connected to ground via gate resistor $R_{GATE}$ and transistor MN1.

When DMOS transistor M1 turns off, the output voltage $V_{OUT}$ at the output node $N_{OUT}$, which was previously low, rises to the load supply voltage $V_{LD}$ which, in turn, causes comparator C1 to output a low voltage when the output voltage $V_{OUT}$ exceeds the reference voltage $V_{REF}$. The low voltage output from comparator C1 causes inverter I1 to drive the flag signal FLAG to a logic high.

One problem with device 10, however, is that DMOS transistor M1 is subject to gate leakage that results from the breakdown of the gate oxide layer. When this occurs, DMOS transistor M1 provides a low-resistance path from the gate to the drain of DMOS transistor M1 which, as shown in FIG. 1, can be modeled as a resistor $R_{GD}$.

When the resistance of resistor $R_{GD}$ becomes small enough, device 10 is unable to turn off DMOS transistor M1 because the voltage on the gate of DMOS transistor M1 is now defined by the series resistance of the gate resistor $R_{GATE}$, the leakage resistor $R_{GD}$, and the resistance $R_{LD}$ of load 20. Thus, using a simple voltage divider, when $V_{LD}$ ($R_{GATE}/R_{GATE}+R_{GD}+R_{LD}$) is equal to or greater than the threshold voltage of DMOS transistor M1, transistor M1 will remain on.

More importantly, when the voltage on the drain of DMOS transistor M1 is greater than the reference voltage $V_{REF}$, i.e., when $V_{LD}(R_{GATE}+R_{GD}/R_{GATE}+R_{GD}+R_{LD})$ is greater than the reference voltage $V_{REF}$, device 10 is unable to detect that DMOS transistor M1 is still turned on because comparator C1 will cause the output of inverter I1 to change the logic state of the flag signal FLAG as soon as the output voltage $V_{OUT}$ rises above the reference voltage $V_{REF}$.

Thus, for a range of leakage resistor $R_{GD}$ values, DMOS transistor M1 will remain turned on while device 10 reports via the flag signal FLAG that transistor M1 is off.

In safety-related systems, such as the ABS used on automobiles, the false reporting of the output voltage along with the inability to detect that transistor M1 has not been turned off raises significant safety issues. Thus, there is a need for a low-side driver circuit that can detect and report excessive gate leakage currents.

SUMMARY OF THE INVENTION

The present invention provides a low-side driver device that detects and reports gate leakage in the DMOS transistor of the device by determining whether the voltage on the gate of the DMOS transistor has exceeded a predetermined value within a predefined period of time when the device is turned on.

In the present invention, a low-side driver device includes a current sink stage and a control stage. The current sinks stage, which is connected to a control node and a load via an output node, sinks a load current from the load which is defined by the voltage on the control node. The control stage, in turn, controls the voltage on the control node in response to the logic state of an enable signal. In addition, the control stage also sets the logic state of a flag signal to a first logic level when an output voltage at the output node is less than a reference voltage, and sets the logic state of the flag signal to a second logic level when the output voltage is greater than the reference voltage.

In accordance with the present invention, the low-side driver also includes a sense stage and a logic stage. The sense stage senses the voltage on the control node, sets a sense signal to a first logic state when the voltage on the control node exceeds a predetermined voltage, and sets the sense signal to a second logic state when the voltage on the control node falls below the predetermined voltage. The logic stage outputs a tracking signal that has a first logic state that indicates when the output voltage is less than the reference voltage and the voltage on the control node is greater than the predetermined voltage in response to the flag signal and the sense signal, and a second logic state that indicates when the output voltage is greater than the reference voltage in response to the flag signal and the sense signal.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
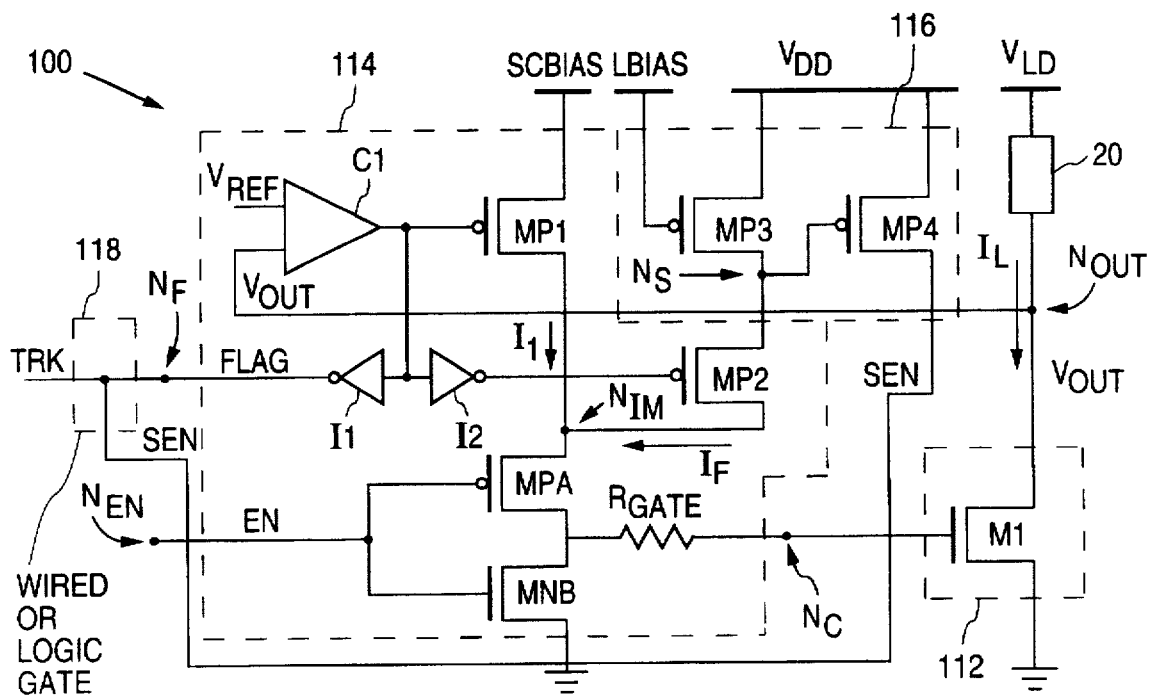
FIG. 2 is a schematic diagram illustrating a low-side driver device 100 in accordance with the present invention.
Figure 3:
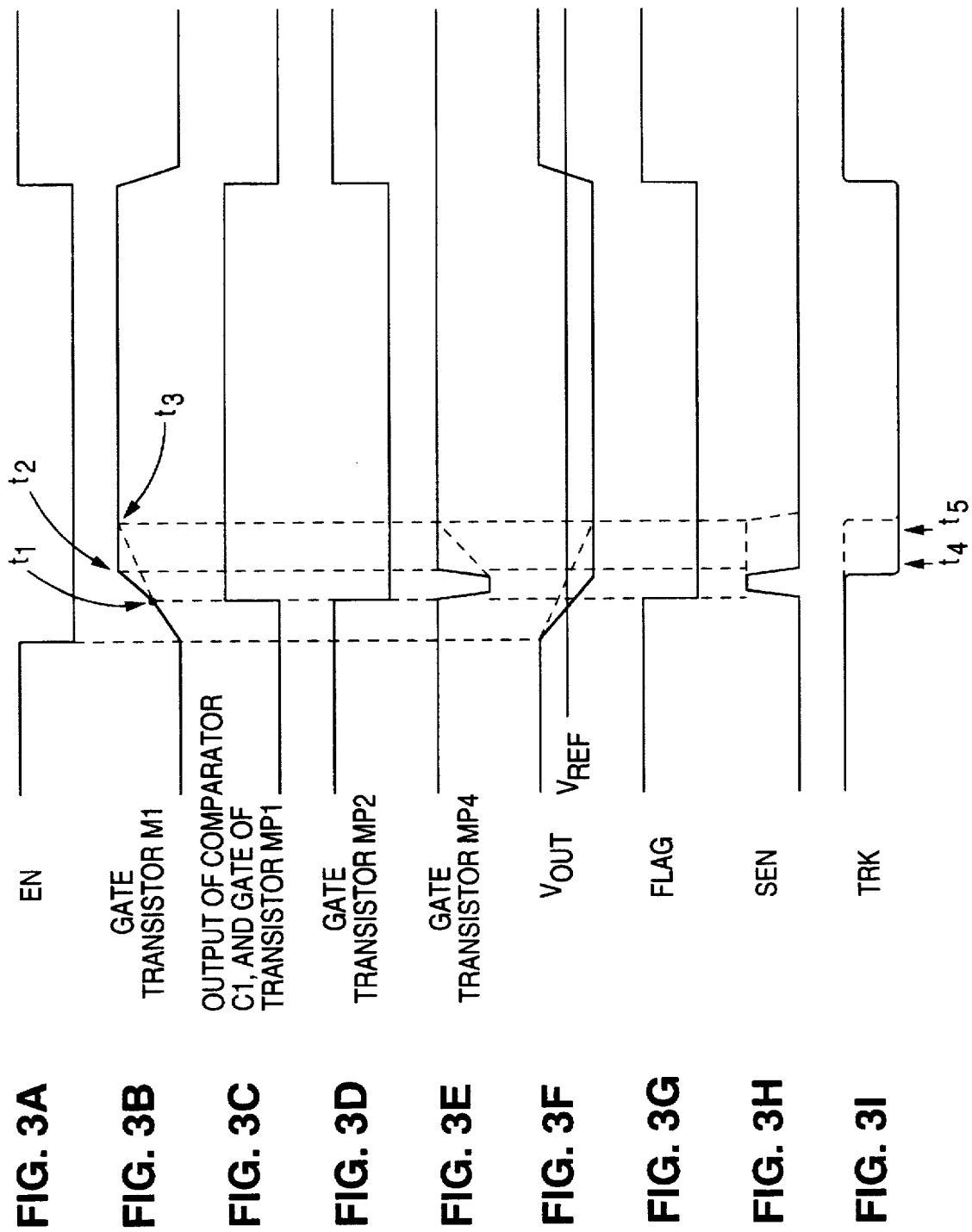
FIGS. 3A–3I are timing diagrams illustrating the turn-on operation of device 100 in accordance with the present-invention.

FIG. 2 shows a schematic diagram of a low-side driver device 100 in accordance with the present invention. As described in greater detail below, the present invention detects gate oxide leakage in the DMOS transistor of a low-side driver device by determining whether the voltage on the gate of the DMOS transistor has exceeded a predetermined value within a predefined period of time.

Figure 1:
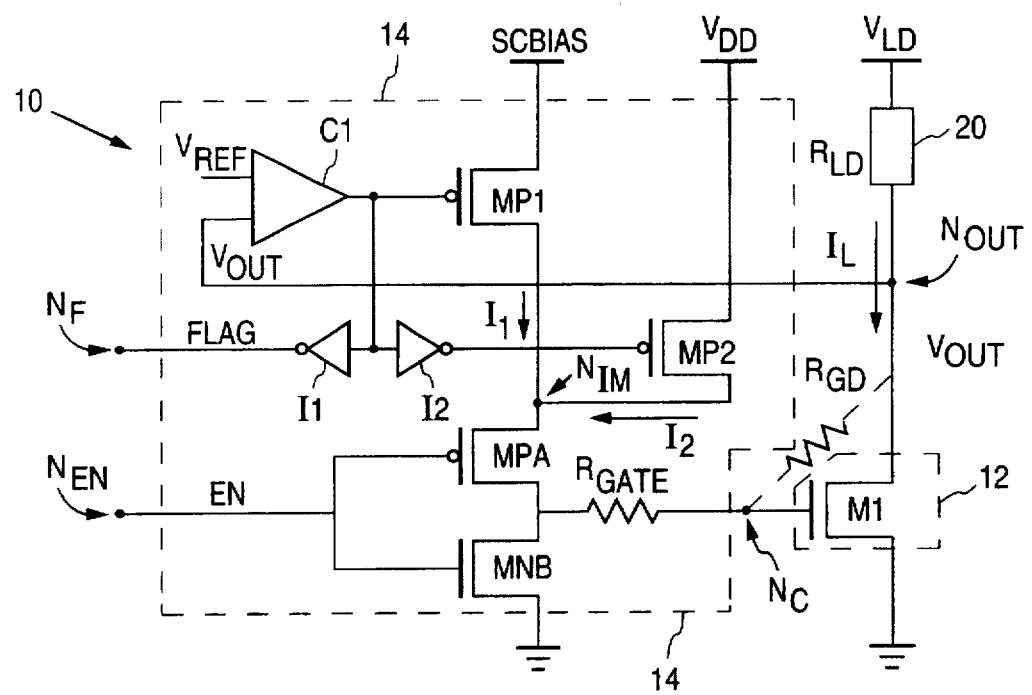
FIG. 1 is a schematic diagram illustrating a conventional low-side driver device 10.

As shown in FIG. 2, device 100 includes a current sink stage 112 and a control stage 114 which are implemented and function the same as current sink stage 12 and control stage 14, respectively, of FIG. 1, except that control stage 114 further includes a sense input connected to a sense node $N_s$.

In accordance with the present invention, device 100 also includes a sense stage 116 connected to control stage 114 that senses the voltage on the control node $N_c$, and sets a sense signal SEN to a predetermined logic state when the voltage on the control node $N_c$ exceeds a predetermined voltage.

Sense stage 116 is implemented with a p-channel transistor MP3 whose drain is connected to the source of transistor MP2, and a p-channel transistor MP4 whose gate is connected to the source of transistor MP2, and whose drain outputs the sense signal SEN.

As further shown in FIG. 2, device 100 further includes a logic stage 118 that outputs a tracking signal TRK that has a logic state which is defined by the logic states of the sense signal SEN output from sense stage 116 and the flag signal FLAG output from control stage 114.

The tracking signal TRK indicates in a first logic state when the output voltage $V_{OUT}$ falls below the reference voltage $V_{REF}$, and a second logic state when the output voltage $V_{OUT}$ exceeds a predefined voltage (the voltage at which transistor MP2 turns off). Logic stage 118 is implemented as a wired OR to logically OR together the sense signal SEN and the flag signal FLAG.

In operation, when device 100 is on and is then turned off, device 100 operates the same as device 10 of FIG. 1. When device 100 is off and is then turned on, device 100 operates the same as device 10 of FIG. 1 up until the point where the output voltage $V_{OUT}$ falls below the reference voltage $V_{REF}$.

FIGS. 3A–3I are timing diagrams that illustrate the turn-on operation of device 100 in accordance with the present invention. As shown in FIGS. 3A–3I, the output voltage $V_{OUT}$ falls below the reference voltage VRSF at time $t_1$ which, in turn, causes the output of comparator C1 to go high.

When the output of comparator C1 goes high, transistor MP2 turns on while the logic state of the flag signal FLAG output from inverter I1 is driven to a logic low. When transistor MP2 of control stage 114 turns on, transistor MP2 begins sourcing a fixed current $I_F$ which is defined by the bias voltage LBIAS applied to transistor MP3.

At the same time, the voltage on the gate of transistor MP4, which was previously high, drops as transistors MP2 and MP3 source the fixed current $I_F$. When the voltage on the gate of transistor MP4 drops, transistor MP4 turns on, thereby causing the voltage on the drain of transistor MP4, which represents the sense signal SEN, to go high. As a result, logic stage 118 continues to output the tracking signal TRK with a logic high which, in turn, indicates that the output voltage $V_{OUT}$ has not fully dropped.

If the gate leakage of DMOS transistor M1 is nonexistent or minimal, then the fixed current $I_F$ sourced by transistor MP2 will charge up the voltage on the gate of DMOS transistor M1 to a final voltage at time $t_2$. Once the final voltage is reached, transistors MP2 and MP3 will stop sourcing the fixed current $I_F$ which, in turn, causes the voltage on the gate of transistor MP4 to rise and turn off transistor MP4. Thus, sense stage 116 senses the voltage on the gate of DMOS transistor M1 via the voltage on the source of transistor MP2.

When transistor MP4 turns off, the logic state of the sense signal SEN changes to a logic low, thereby causing the logic state of the tracking signal TRK to also go low. Thus, if DMOS transistor M1 has little or no gate leakage, then the tracking signal TRK will go low a predefined time (time $t_2$ plus the circuit response time) after device 100 has been turned on.

One advantage of this approach is that the functioning of transistors MP3 and MP4 can also be tested by checking the logic state of the tracking signal TRK just prior to time $t_2$. If, for example, transistor MP3 has failed and is effectively shorting voltage $V_{DD}$ to sense node $N_s$, then transistor MP2 will source a much larger current which, in turn, will prevent the voltage at sense node $N_s$ from dropping enough to turn on transistor MP4.

If transistor MP4 fails to turn on, then the sense signal SEN will remain low which will cause the tracking signal TRK will go low before time $t_2$. Similarly, if transistor MP4 is malfunctioning such that the sense signal SEN continuously remains low, the tracking signal TRK will also go low before time $t_2$. Thus, by checking the logic state of the sense signal SEN prior to time $t_2$, the operation of transistors MP3 and MP4 can also be tested.

Turning now to the leakage condition, if DMOS transistor M1 has a gate leakage problem, then the amount of time required to charge up the voltage on the gate of DMOS transistor M1 will be longer because some of the fixed current $I_F$ flowing into the gate will have leaked out. Thus, if gate leakage is a problem, the voltage on the gate of DMOS transistor M1 will not be charged up until time $t_3$.

By checking the logic state of the tracking signal TRK after the predefined time has expired (time $t_2$ plus the circuit response time), but prior to time $t_3$, the gate leakage condition can be detected. For example, if the logic state of the tracking signal TRK is low at time $t_4$, a time immediately after the predefined time, then no gate leakage condition exists because the gate voltage on DMOS transistor M1 was sufficient to turn off transistor MP4.

On the other hand, if the logic state of the tracking signal remains high at time $t_5$, a time immediately before time $t_3$, then a gate leakage condition exists because the gate leakage current has increased the time required to charge up the voltage on the gate of DMOS transistor M1.

The time at which the tracking signal TRK must be checked is a function of how quickly the fixed current $I_F$ must charge up the gate of DMOS transistor M1 when no leakage current condition exists. The larger the magnitude of the fixed current $I_F$, the sooner the tracking signal TRK must be checked after time $t_2$ to avoid an erroneous reading.

For example, if a defined gate leakage current is sufficient to keep DMOS transistor M1 turned on, then a fixed current which is only somewhat larger than the defined gate leakage current will take substantially longer to charge up the voltage on the gate of DMOS transistor M1 because most of the current flowing in to the gate is also leaking out.

On the other hand, if the fixed current is substantially larger than the defined gate leakage current, then the fixed current will take only slightly longer to charge up the voltage on the gate of DMOS transistor M1 because only a small fraction of the current flowing into the gate is also leaking out.

Thus, when a gate leakage condition exists, sense stage 116 extends the length of the tracking pulse TRK. By extending the length of the tracking pulse TRK, the gate leakage condition can be detected by checking the logic state of the pulse after time $t_2$, but before time $t_3$.

Therefore, in accordance with the present invention, a low-side driver device has been described that detects gate oxide leakage in the DMOS transistor by determining whether the voltage on the gate of the DMOS transistor has exceeded a predetermined value within the predefined period of time.

Figure 4:
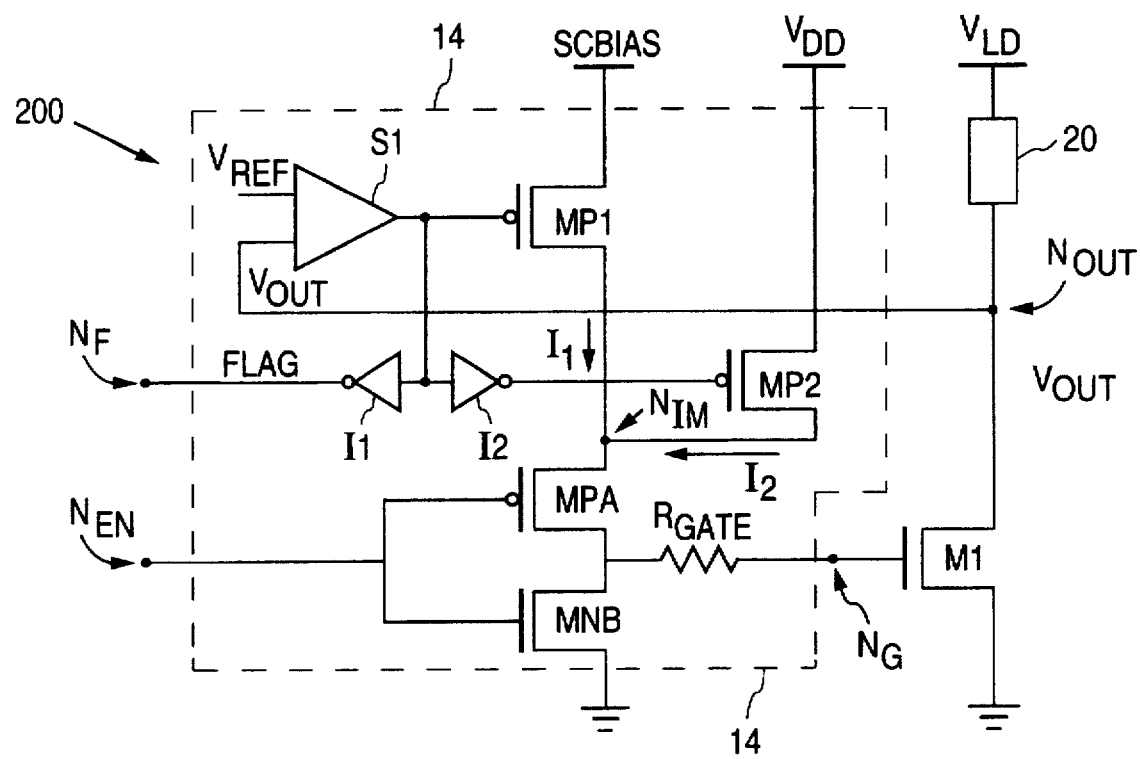
FIG. 4 is a schematic diagram illustrating a low-side driver device 200 in accordance with a first alternative embodiment of the present invention.

In a first alternate embodiment, rather than using sense stage 116 and logic stage 118, a Schmitt trigger comparator is used in lieu of comparator C1. FIG. 4 shows a schematic diagram illustrating a low-side driver device 200 in accordance with a first alternative embodiment of the present invention.

As shown in FIG. 4, device 200 is the same as device 10 of FIG. 1 except that a Schmitt trigger comparator S1 is used instead of comparator C1. In accordance with the present invention, when comparator S1 is utilized, the lower threshold $V_{TL}$ is set to be equal to the reference voltage VREF, while the upper threshold voltage $V_{TH}$ is set to be equal to the predetermined voltage that turned off transistor MP4 of FIG. 2.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A low-side driver device for sinking current from a load, the device comprising:

a current sink stage connected to a control node and to the load via an output node, the current sink stage sinking a load current from the load in response to a control voltage on the control node;

a control stage connected to the current sink stage via the control node and the output node, the control stare controlling the control voltage in response to an enable signal, and indicating when an output voltage on the output node is less than a reference voltage, and when the output voltage is greater than the reference voltage;

a sense stage connected to the control stage via a sense node, the sense stage indicating when a sense voltage on the sense node is treater than a predetermined voltage, and when the sense voltage is less than the predetermined voltage, the sense voltage changing in response to changes in the control voltage when the output voltage is below the reference voltage and the enable signal enables the control stage; and a logic stage connected to the control stage and the sense stage, the logic stage outputting a tracking signal having a first logic state when the output voltage is less than the reference voltage and the sense voltage is greater than the predetermined voltage, a second logic state when the output voltage is greater than the reference voltage, and the second logic state when the output voltage is less than the reference voltage and the sense voltage is less than the predetermined voltage.

2. The device of claim 1 wherein the control stage raises the voltage on the control node to a first voltage when the enable signal enables the control stare and the voltage on the output node is greater than the reference voltage, raises the voltage on the control node to a second voltage when the enable signal enables the control stage and the voltage on the output node is less than the reference voltage, and lowers the voltage on the control node to a third voltage when the enable signal disables the control stage.

3. The device of claim 2 wherein the control stage includes:

a comparator stage connected to the output node that compares the output voltage to the reference voltage, indicates when the output voltage is greater than the reference voltage, and indicates when the output voltage is less than the reference voltage;

a first stage connected to the comparator stage that is biased to output a first value when the comparator stage indicates that the output voltage is greater than the reference voltage;

a second stage connected to the comparator stage that is biased to output a second value when the comparator stage indicates that the output voltage is less than the reference voltage; and a switch stage connected to the first and second stages that applies the first voltage to the control node by passing the first value when the enable signal enables the control stage and the output voltage is greater than the reference voltage, the second voltage to the control node by passing the second value when the enable signal enables the control stage and the output voltage is less than the reference voltage, and the third voltage to the control node by passing the third voltage when the enable signal disables the control stage.

4. The device of claim 3 wherein the second stage includes a first transistor connected to the comparator stage, the switch stage, and a sense node.

5. The device of claim 4 wherein the first transistor sources a fixed current.

6. The device of claim 4 wherein the sense stage includes:

a second transistor connected to the sense node, a bias node, and a power supply node; and a third transistor connected to the sense node, the power supply node, and the logic stage.

7. The device of claim 1 wherein the logic stage includes a wired OR.

8. The device of claim 1 wherein the current sink stage includes a DMOS transistor.

9. The device of claim 3 wherein the first and second values are currents.

10. A low-side driver device for sinking current from a load, the device comprising:

a current sink stage having a controlled input, and a load input connected to the load, the current sink stage sinking a load current from the load in response to a control voltage on the controlled input;

a control stage having an enable input, a feedback input connected to the load input, a sense input, a controlled output connected to the controlled input, and a flag output, the control stage controlling the control voltage on the controlled output in response to a voltage on the enable input, and indicating via the flag output when an output voltage at the feedback input is less than a reference voltage, and when the output voltage is greater than the reference voltage;

a sense stage having a sense output connected to the sense input and a signal output, the sense stage sensing the voltage on the controlled output, and indicating via the signal output when the voltage at the controlled output exceeds a predetermined voltage; and a logic stage having a flag input connected to the flag output, a signal input connected to the signal output, and a logic output, the logic stage indicating when the output voltage is less than the reference voltage and the voltage on the controlled output is greater than the predetermined voltage in response to the indications on the flag input and the signal input.

11. The device of claim 10 wherein the control stage raises the voltage on the controlled output to a first voltage when the voltage on the enable input enables the control stage and the voltage on the feedback input is greater than the reference voltage, raises the voltage on the controlled output to a second voltage when the voltage on the enable input enables the control stage and the voltage on the feedback input is less than the reference voltage, lowers the voltage on the controlled output to a third voltage when the voltage on the enable input disables the control stage.

12. The device of claim 11 wherein the control stage includes:

a comparator stage connected to the feedback input that compares the output voltage to the reference voltage, indicates when the output voltage is greater than the reference voltage, and indicates when the output voltage is less than the reference voltage;

a first stage connected to the comparator stage that is biased to output a first value when the comparator stage indicates that the output voltage is greater than the reference voltage;

a second stage connected to the comparator stage that is biased to output a second value when the comparator stage indicates that the output voltage is less than the reference voltage; and a switch stage connected to the first and second stages that applies the first voltage to the controlled output by passing the first value when the voltage at the enable input enables the control stare and the output voltage is greater than the reference voltage, the second voltage to the controlled output by passing the second value when the voltage at the enable input enables the control stage and the output voltage is less than the reference voltage, and the third voltage to the controlled output by passing the third value when the voltage at the enable input disables the control stage.

13. The device of claim 12 wherein the second stage includes a first transistor connected to the comparator stage, the switch stage, and a sense node.

14. The device of claim 13 wherein the first transistor sources a fixed current.

15. The device of claim 13 wherein the sense stage includes:

a second transistor connected to the sense node, a bias node, and a power supply node; and a third transistor connected to the sense node, the power supply node, and the logic stage.

16. The device of claim 10 wherein the logic stage wire ORs the flag input and the signal input.

17. The device of claim 10 wherein the current sink stage includes a DMOS transistor.

18. A method for sinking current from a load, the method comprising the steps of:

sinking a load current from the load through an output node, the magnitude of the load current being responsive to a controlled voltage;

controlling the controlled voltage in response to the logic state of an enable signal;

setting the logic state of a flag signal to indicate when an output voltage at the output node is less than a reference voltage, and setting the logic state of the flag signal to indicate when the output voltage is greater than the reference voltage;

setting the logic state of a sense signal to indicate when a sense voltage exceeds a predetermined voltage, and when the sense voltage falls below the predetermined voltage, the sense voltage changing in response to changes in the controlled voltage when the output voltage is less than the reference voltage and the enable signal is enabled; and outputting a tracking signal having a first logic state when the output voltage is less than the reference voltage and the sense voltage is greater than the predetermined voltage in response to the flag signal and the sense signal, a second logic state when the output voltage is greater than the reference voltage in response to the flag signal and the sense signal, and the second logic state when the output voltage is less than the reference voltage and the sense voltage is less than the predetermined voltage in response to the flag signal and the sense signal.

19. A method for determining whether a low-side driver device is leaking current, the method comprising the steps of:

determining when an output voltage falls below a reference voltage, and when the output voltage rises above the reference voltage;

determining when a sense voltage falls below a predetermined voltage, and when the sense signal rises above the predetermined voltage; and determining whether the sense voltage has risen above the predetermined voltage within a first predefined time after determining that the output voltage has fallen below the reference voltage.

20. The method of claim 19 and further comprising the step of determining whether the sense voltage is below the predetermined voltage within a second predefined time after determining that the output voltage has fallen below the reference voltage, the second predefined time being less than the first predefined time.

21. A method for determining whether a low-side driver device is leaking current, the low-side driver device including:

a first stage connected to a control node and to the load via an output node, the first stage sinking a load current from the load in response to a control voltage on the control node;

a second stage connected to the first stage via the control node and the output node, the second stage controlling the control voltage in response to an enable signal, and indicating when an output voltage on the output node is less than a first voltage, when the output voltage is greater than the first voltage, when the output voltage is less than a second voltage, and when the output voltage is greater than the second voltage;

the method comprising the steps of:

checking indications from the second stage to determine if the output voltage is below the first voltage;

when the output voltage is determined to be below the first voltage, checking indications from the second stage after a first predefined time to determine if the output voltage has fallen below the second voltage; and declaring a leakage condition when the output voltage fails to fall below the second voltage after the first predefined time.

22. The method of claim 21 wherein the second stage includes a sense stage and a control stage connected via a sense node, the sense stage indicating when a sense voltage on the sense node is greater than a predetermined voltage, and when the sense voltage is less than the predetermined voltage, the sense voltage changing in response to changes in the control voltage when the output voltage falls below the first voltage and the enable signal enables the second stage; and wherein the when the output voltage step comprises the step of checking indications from the sense stage after the first predefined time to determine if the sense voltage has risen above the predetermined voltage, the sense voltage rising above the predetermined voltage when the output voltage falls below the second voltage.

23. The method of claim 22 and further comprising the steps of:

checking indications from the sense stage when the output voltage is determined to be below the first voltage to determine if the sense voltage is above the predetermined voltage after a second predefined time, the second predefined time being less than the first predefined time; and declaring a failure condition when the sense voltage remains above the predetermined voltage after the second predefined time.

* * * * *

UNITED STATES PATENT AND TRADEMARK OFFICE
CERTIFICATE OF CORRECTION

PATENT NO.: 5,798,662
DATED: August 25, 1998
INVENTOR(S): Mark W. Marosek et al.

It is certified that four errors appear in the above-identified patent and that said Letters Patent is hereby corrected as shown below:

In Col. 6, line 44, delete "stare" and replace with --stage--.

In Col. 6, line 51, delete "treater" and replace with --greater--.

In Col. 7, line 1, delete "stare" and replace with --stage--.

In Col. 8, line 38, delete "stare" and replace with --stage--.

Signed and Sealed this

First Day of December, 1998

Attest:

Attesting Officer

BRUCE LEHMAN
Commissioner of Patents and Trademarks